United States Patent
Kang et al.

(10) Patent No.: US 7,453,198 B2
(45) Date of Patent: Nov. 18, 2008

(54) ORGANIC LIGHT EMITTING DISPLAY AND METHOD OF FABRICATING THE SAME

(75) Inventors: Tae-Wook Kang, Suwon-si (KR); Kwan-Hee Lee, Suwon-si (KR)

(73) Assignee: Samsung SDI Co., Ltd., Suwon-si, Gyeonggi-do (KR)

( * ) Notice: Subject to any disclaimer, the term of this patent is extended or adjusted under 35 U.S.C. 154(b) by 510 days.

(21) Appl. No.: 11/218,494

(22) Filed: Sep. 6, 2005

(65) Prior Publication Data

US 2006/0049753 A1    Mar. 9, 2006

(30) Foreign Application Priority Data

Sep. 8, 2004    (KR) .................. 10-2004-0071891

(51) Int. Cl.
*H01J 63/04* (2006.01)

(52) U.S. Cl. ............................................ 313/498
(58) Field of Classification Search ................ None
See application file for complete search history.

(56) References Cited

U.S. PATENT DOCUMENTS

2003/0234608 A1 *   12/2003   Lee et al. .................. 313/504

* cited by examiner

*Primary Examiner*—Toan Ton
*Assistant Examiner*—Britt Hanley
(74) *Attorney, Agent, or Firm*—Robert E. Bushnell, Esq.

(57) ABSTRACT

An OLED and a method of fabricating the same are provided, in which, when a reflective layer pattern is formed, a thin layer for a pixel electrode is opened at an edge of an emission region to form the pixel electrode without additional photolithography and etching processes by forming an undercut under the edge of the reflective layer pattern, i.e., under the edge of the emission region by over-etching, thereby simplifying the process and increasing the yield.

9 Claims, 5 Drawing Sheets

ORGANIC LIGHT EMITTING DISPLAY AND METHOD OF FABRICATING THE SAME

CLAIM OF PRIORITY

This application claims priority to and the benefit of Korean Patent Application No. 2004-71891, filed Sep. 8, 2004, which is hereby incorporated by reference for all purposes as if fully set forth herein.

BACKGROUND OF THE INVENTION

1. Field of the Invention

The present invention relates to an organic light emitting display (OLED) and method of fabricating the same and, more particularly, to an OLED and method of fabricating the same, which can simplify the fabricating process by automatically patterning a pixel electrode.

2. Discussion of the Background

In general, an OLED is a self-emissive display in which light is emitted by exciting fluorescent organic compounds. The OLED can be classified into a passive matrix OLED (PMOLED) and an active matrix OLED (AMOLED) according to a driving method of N×M pixels, which are arranged in a matrix shape. In comparison with the PMOLED, the AMOLED is suitable for large-area displays due to its low power consumption and has high resolution.

In another approach, the OLED can be classified into a top-emitting OLED, a bottom-emitting OLED and a double-sided emitting OLED based on the direction in which light is emitted from organic compounds. Unlike the bottom-emitting OLED, the top-emitting OLED is a display in which light is emitted in an opposite direction to a substrate on which unit pixels are arranged and has an advantage of a high aperture ratio.

As described above, the OLED is a self-emissive display and thus requires no additional light sources. However, in order to improve luminous efficiency, some OLEDs may use as a light source by reflecting external light using a reflective layer formed of a metal with excellent reflective properties.

In the conventional OLED, when the reflective layer is formed of Al, while the reflective layer and a thin layer for the pixel electrode are being patterned at the same time, both of them are exposed to an electrolytic solution used for photolithography and etching processes. Thus, a material having a greater electromotive force corrodes due to galvanic corrosion, thereby damaging the pixel electrode. To overcome this problem, in another conventional method, the reflective layer and the thin layer for the pixel electrode are separately patterned using different photolithography and etching processes. However, in this case, the number of photolithography and etching processes is increased so that the entire fabrication process is more complicated, thereby causing a drop in yield and increasing the production cost.

SUMMARY OF THE INVENTION

It is therefore an object of the present invention to provide an improved organic light emitting display.

It is also an object of the present invention to provide an improved method of making an organic light emitting display.

It is another object of the present invention to solve aforementioned problems associated with conventional displays and methods.

It is a further object of the present invention to provide an OLED and a method of fabricating the same, in which, when a reflective layer pattern is formed, a thin layer for a pixel electrode is opened at an edge of an emission region to form the pixel electrode without additional photolithography and etching processes by forming an undercut under the edge of the reflective layer pattern, i.e., under the edge of the emission region by over-etching, thereby simplifying the process and increasing the yield.

In an exemplary embodiment of the present invention, an OLED includes: a thin-film transistor (TFT) disposed on a substrate and having a gate electrode, a source electrode, and a drain electrode; an insulating layer disposed on the substrate, the insulating layer having a via-contact hole; a reflective layer pattern disposed in an emission region and connected to one of the source and drain electrodes through the via-contact hole, the reflective layer pattern having a horizontal protrusion by an undercut formed at an edge of the emission region of the insulating layer; a first electrode disposed on the reflective layer pattern and the insulating layer, the first electrode disposed on the reflective layer pattern and the first electrode disposed on the insulating layer disconnected to each other at an edge of the reflective layer pattern; an organic layer disposed on the first electrode in a portion of the emission region and having at least an emission layer; and an second electrode disposed on the organic layer.

The depth of the undercut may be at least twice as great as the thickness of the first electrode.

In another exemplary embodiment of the present invention, a method of fabricating an OLED includes: preparing a substrate; forming a thin-film transistor on the substrate, the thin film transistor comprising a gate electrode, a source electrode and a drain electrode; forming an insulating layer on the substrate, the insulating layer having a via-contact hole; forming a reflective layer pattern protruding in a horizontal direction in an emission region by an undercut under an edge of the reflective layer pattern, the reflective layer pattern connected to one of the source electrode and the drain electrode through the via-contact hole; forming a first electrode on the reflective layer pattern and the insulating layer, the first electrode disposed on the reflective layer pattern and the first electrode disposed on the insulating layer disconnected to each other by the undercut; forming an organic layer comprising at least an emission layer on the first electrode in a portion of the emission region; and forming a second electrode on the organic layer.

In another exemplary embodiment of the present invention, a method of fabricating an OLED includes: forming a TFT having a gate electrode to form a first structure, a source electrode, and a drain electrode on a substrate; forming an insulating layer on the first structure to form a second structure, the insulating layer having a via-contact hole that exposes one of the source and drain electrodes; forming a reflective layer on the second structure, the reflective layer being connected to one of the source and drain electrodes through the via-contact hole; forming a reflective layer pattern protruding in a horizontal direction by etching the reflective layer and removing the insulating layer disposed under an edge of the reflective layer pattern to form an undercut under the edge of the reflective layer pattern; forming a first electrode by forming a thin layer for a first electrode on the resultant structure, the first electrode being patterned by the undercut formed under the edge of the reflective layer pattern; forming an organic layer having at least an emission layer on the first electrode; and forming an second electrode on the organic layer.

The undercut may be formed by a dry etching process.

The undercut may be formed to a depth of at least twice as great as the thickness of the pixel electrode.

BRIEF DESCRIPTION OF THE DRAWINGS

A more complete appreciation of the present invention, and many of the above and other features and advantages of the present invention, will be readily apparent as the same becomes better understood by reference to the following detailed description when considered in conjunction with the accompanying drawings in which like reference symbols indicate the same or similar components, wherein.

DETAILED DESCRIPTION

Figure 1:
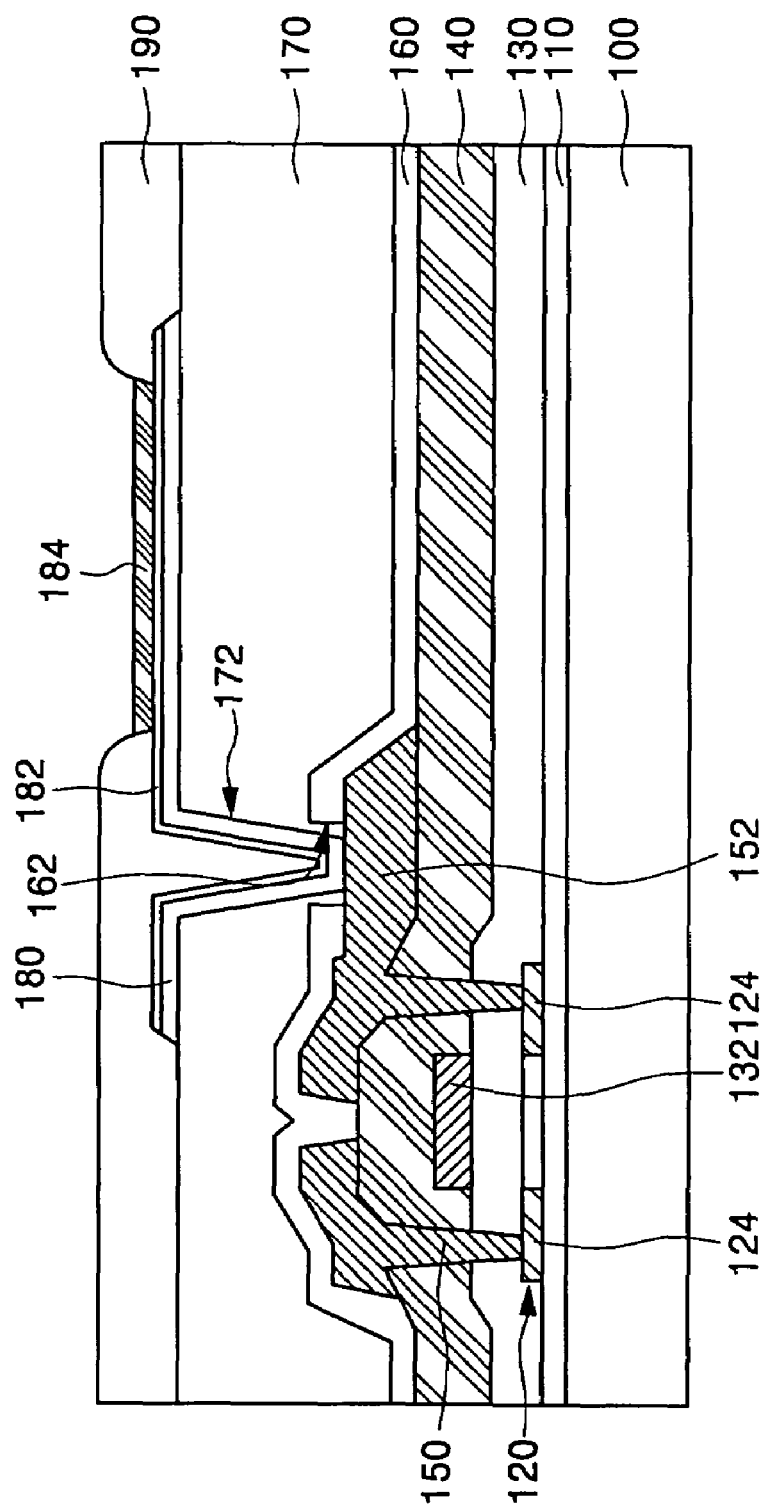
FIG. 1 is a schematic cross-sectional view of a conventional OLED.

Hereinafter, a conventional structure of an organic light emitting display and preferable embodiments according to the present invention will be described with reference to the accompanying drawings. Here, when one element is connected to another element, one element may be not only directly connected to another element but also indirectly connected to another element via another element. Further, irrelative elements are omitted for clarity. Also, like reference numerals refer to like elements throughout.

FIG. 1 is a schematic cross-sectional view of a conventional organic light emitting display.

Referring to FIG. 1, a buffer layer 110 having a predetermined thickness is formed on a substrate 100, and a thin-film transistor (TFT) including a polycrystalline silicon (poly-Si) pattern 120, a gate electrode 132, a source electrode 150, and a drain electrode 152 is formed. In this case, source and drain regions 124, which are ion-implanted with impurities, are disposed at both sides of the poly-Si pattern 120, and a gate insulating layer 130 is disposed on the entire surface of the resultant structure including the poly-Si pattern 120.

An interlayer insulating layer 140 having a predetermined thickness is disposed on the gate insulating layer 130.

The interlayer insulating layer 140 and the gate insulating layer 130 are etched by photolithography and etching processes such that a contact hole (not shown) exposing the source and drain regions 124 is formed. An electrode material is deposited on the entire surface of the resultant structure including the contact hole and etched by photolithography and etching processes, thereby forming a source electrode 150 and a drain electrode 152, which are connected to the source and drain regions 124, respectively.

Thereafter, a passivation layer 160 having a predetermined thickness is formed on the entire surface of the resultant structure and then etched by photolithography and etching processes, thereby forming a first via-contact hole 162 to expose one of the source and drain electrodes 150 and 152, for example, the drain electrode 152. The passivation layer 160 is an inorganic insulating layer formed of silicon nitride, silicon oxide, or a laminated structure thereof.

Thereafter, a planarization layer 170 is formed on the entire surface of the resultant structure. The planarization layer 170 may be formed of one selected from the group consisting of polyimide, benzocyclobutene series resin, spin on glass (SOG), and acrylate.

The planarization layer 170 is then etched by photolithography and etching processes, thereby forming a second via-contact hole 172 to expose the one of the source and drain electrodes 150 and 152, for example, the drain electrode 152, which is exposed by the first via-contact hole 162.

Next, a reflective layer (not shown) and a thin layer (not shown) for a pixel electrode are laminated on the entire surface of the resultant structure. The reflective layer is formed of highly reflective metal such as Al, Mo, Ti, Au, Ag, Pd, and an alloy thereof. When the reflective layer is formed as described above, a top-emitting OLED is obtained. However, when the reflective layer is formed in a subsequent process, a bottom-emitting OLED is obtained. The thin layer for the pixel electrode is formed to a thickness of about 10 to about 300 Å using a transparent metal such as indium tin oxide (ITO).

The laminated structure including the reflective layer and the thin layer for the pixel electrode is etched by photolithography and etching processes, thereby forming a pixel electrode 182 and a reflective layer pattern 180, which are connected to one of the source and drain electrodes 150 and 152, for example, the drain electrode 152.

Thereafter, a pixel defining layer pattern 190 is formed on the entire surface of the resultant structure to define an emission region. The pixel defining layer pattern 190 may be formed of one selected from the group consisting of polyimide, benzocyclobutene series resin, phenol resin, and acrylate.

An organic layer 184 including at least an emission layer is formed on a portion of the pixel electrode 182 where the pixel defining layer pattern 190 is exposed. The organic layer 184 is obtained by a small molecule deposition method, or a laser induced thermal imaging method. The organic layer 184 may further include at least one selected from the group consisting of an electron injection layer (EIL), an electron transport layer (ETL), a hole injection layer (HIL), a hole transport layer (HTL), and a hole blocking layer. Thereafter, an opposite electrode (not shown) is formed so that an OLED can be completed. The OLED has an anode and a cathode. In this specification, the pixel electrode (first electrode) and the opposite electrode (second electrode) are described. The opposite electrode is the cathode when the pixel electrode is anode, and the opposite electrode is the anode when the pixel electrode is the cathode.

When the completed display is a top-emitting OLED, a transparent electrode or a transparent metal electrode is used as the opposite electrode. However, in the case of a bottom-emitting OLED, the opposite electrode is a metal electrode or a reflective electrode.

In the OLED according to FIG. 1, when the reflective layer is formed of Al, while the reflective layer and the thin layer for the pixel electrode are being patterned at the same time, both of them are exposed to an electrolytic solution used for photolithography and etching processes. Thus, a material having a greater electromotive force corrodes due to galvanic corrosion, thereby damaging the pixel electrode.

Figure 2A:
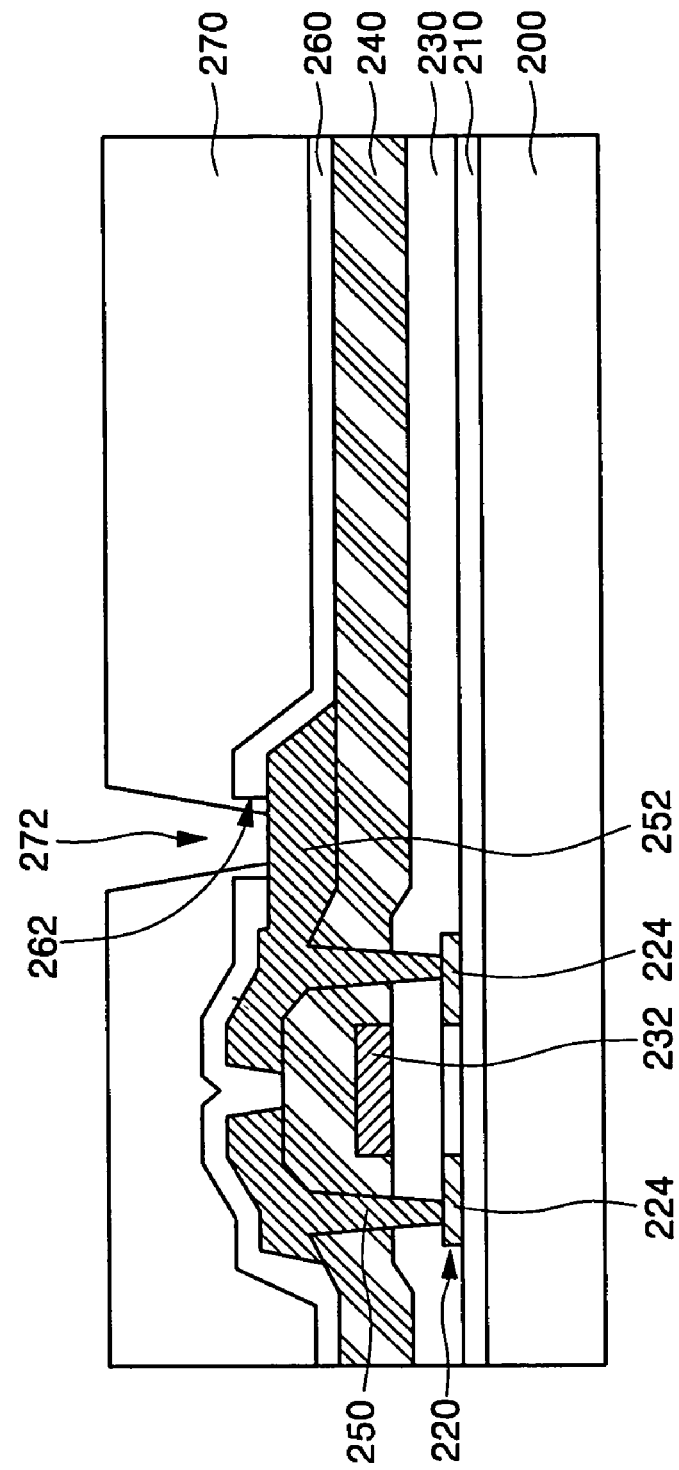
FIGS. 2A through 2C are schematic cross-sectional views illustrating a method of fabricating an OLED according to the present invention.
Figure 2B:
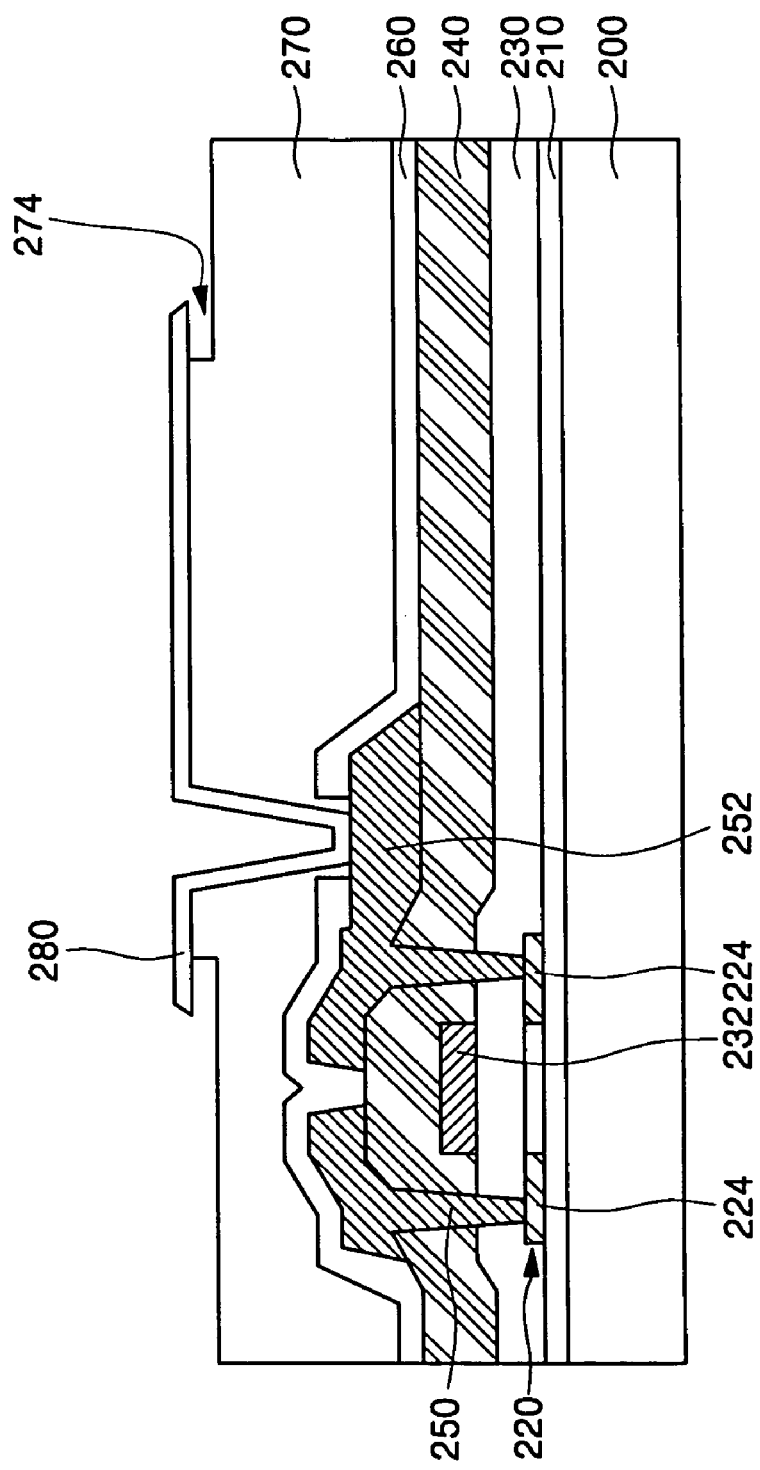
Figure 2C:
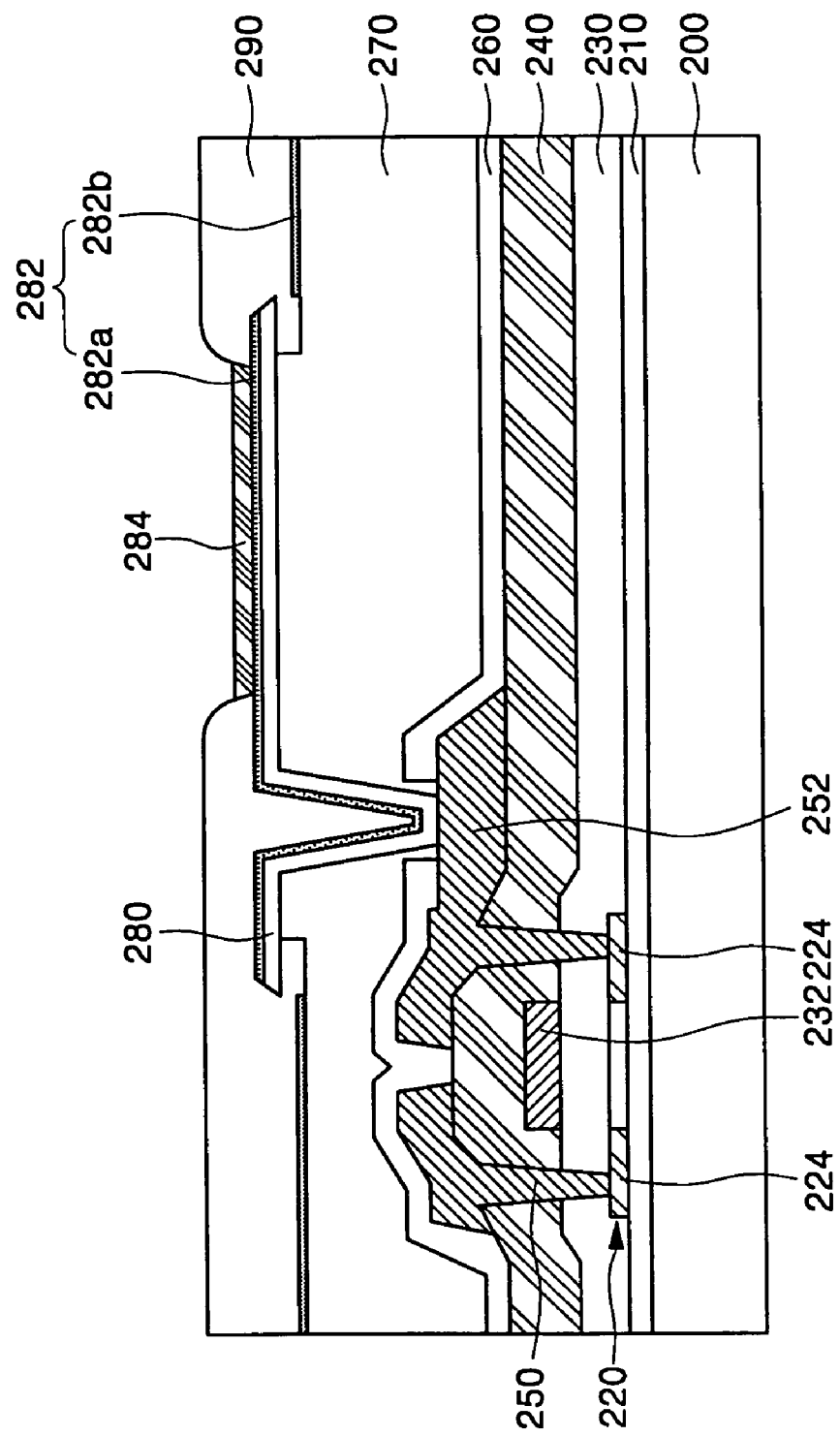
Figure 3:
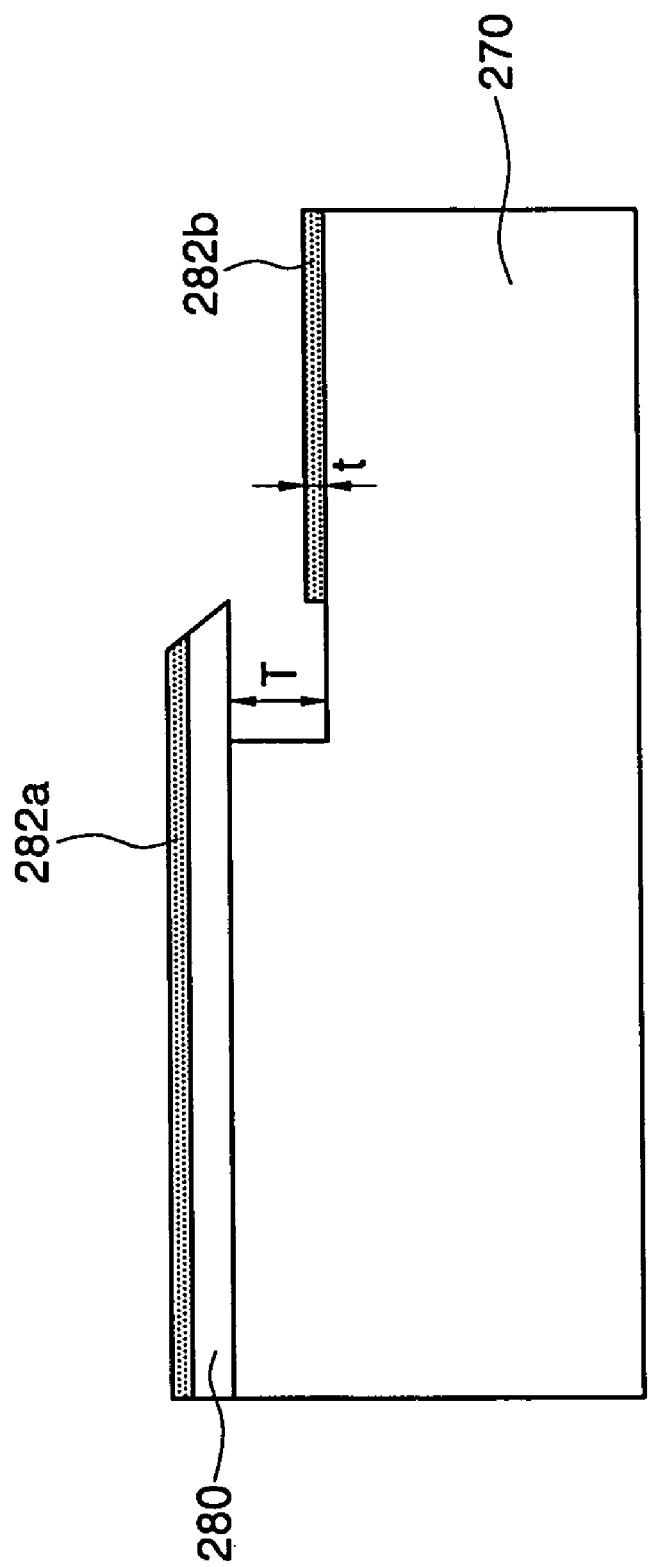
FIG. 3 is a detailed cross-sectional view of an edge of an emission region of an OLED according to the present invention.

FIGS. 2A through 2C are schematic cross-sectional views illustrating a method of fabricating an OLED according to the present invention, and FIG. 3 is a detailed cross-sectional view of an edge of an emission region of an OLED according to the present invention.

Referring to FIG. 2A, a buffer layer 210 having a predetermined thickness is formed on the entire surface of a substrate 200, which is formed of glass, quartz, or sapphire. The buffer layer 210 is formed of silicon oxide using a plasma-enhanced chemical vapor deposition (PECVD) method. This buffer layer 210 prevents diffusion of impurities in the substrate 200 during crystallization of an amorphous silicon (a—Si) layer to be formed in a subsequent process.

Thereafter, an a—Si layer (not shown) having a predetermined thickness is deposited on the buffer layer 210. The a—Si layer is then crystallized using an excimer laser annealing (ELA) method, a sequential lateral solidification (SLS) method, a metal induced crystallization (MIC) method, or a metal induced lateral crystallization (MILC) method and patterned using photolithography and etching processes, thereby forming a poly-Si pattern 220 in a thin-film transistor (TFT) region of a unit pixel. The poly-Si pattern 220 includes source and drain regions 224 to be formed in a subsequent process.

Next, a gate insulating layer 230 having a predetermined thickness is formed on the entire surface of the resultant structure. The gate insulating layer 230 may be formed of silicon oxide, silicon nitride, or a laminated structure thereof.

A metal layer (not shown) is formed as a gate electrode material on the gate insulating layer 230. The metal layer may be formed of a single layer of Al or an Al alloy (e.g., Al—Nd), or a multiple layer of an Al alloy laminated on a Cr or Mo alloy. The metal layer is etched by photolithography and etching processes to form a gate electrode 232. Subsequently, impurity ions are implanted into the poly-Si pattern 220 below both sides of the gate electrode 232, thereby forming source and drain regions 224.

Thereafter, an interlayer insulating layer 240 having a predetermined thickness is formed on the entire surface of the resultant structure. The interlayer insulating layer 240 is typically formed of a silicon nitride layer.

The interlayer insulating layer 240 and the gate insulating layer 230 are etched by photolithography and etching processes such that a contact hole (not shown) exposing the source and drain regions 224 is formed. An electrode material is deposited on the entire surface of the resultant structure including the contact hole and etched by photolithography and etching processes, thereby forming a source electrode 250 and a drain electrode 252, which are connected to the source and drain regions 224, respectively. The electrode material may be MoW, Al—Nd, or a laminated structure thereof.

Thereafter, a passivation layer 260 is formed on the entire surface of the resultant structure by depositing silicon nitride, silicon oxide, or a laminated structure thereof to a predetermined thickness.

The passivation layer 260 is etched by photolithography and etching processes, thereby forming a first via-contact hole 262 to expose one of the source and drain electrodes 250 and 252, for example, the drain electrode 252.

A planarization layer 270 is then formed on the entire surface of the resultant structure. The planarization layer 270 is formed to such a thickness as to completely planarize the TFT region and using one selected from the group consisting of polyimide, benzocyclobutene series resin, spin on glass (SOG), and acrylate.

The planarization layer 270 is etched by photolithography and etching processes, thereby forming a second via-contact hole 272 to expose the one of the source and drain electrodes 250 and 252, for example, the drain electrode 252, which is exposed by the first via-contact hole 262. It is possible to form the first and second via-contact holes 262 and 272 using only one photolithography and etching.

Thereafter, a reflective layer (not shown) is formed on the entire surface of the resultant structure. The reflective layer is formed of one selected from the group consisting of Al, Mo, Ti, Au, Ag, Pd, and an alloy thereof, which has a reflectivity of 50% or more.

Referring to FIG. 2B, in order to protect an emission region, a photoresist pattern (not shown) is formed on the reflective layer. After that, the reflective layer is etched using the photoresist pattern as an etch mask, thereby forming a reflective layer pattern 280. In this case, the reflective layer is over-etched so that the planarization layer 270 disposed thereunder can be removed by a predetermined thickness to form an undercut 274 under an edge of the reflective layer pattern 280. Thus, the edge of the reflective layer pattern 280 protrudes in a horizontal direction. To remove the planarization layer 270 by the predetermined thickness, the reflective layer may be wet-etched and then dry-etched. Alternatively, after the reflective layer is dry-etched to form the reflective layer pattern 280, the reflective layer may be over-etched such that the planarization layer 270 is removed by the predetermined thickness.

Referring to FIG. 2C, a thin layer 282 for a pixel electrode is formed on the entire surface of the resultant structure. The thin layer 282 for the pixel electrode may be formed by depositing a transparent metal such as indium tin oxide (ITO), indium zinc oxide (IZO), $In_2O_3$, or $Sn_2O_3$, to a thickness of 10 to 300 Å.

Since the undercut 274 is formed under the edge of the reflective layer pattern 280, i.e., under the edge of the emission region, while the thin layer 282 for the pixel electrode is being deposited, a pixel electrode 282a is formed at the same time. As the thin layer 282 for the pixel electrode is opened (i.e., as the thin layer on the portion 282a and the thin layer on the portion 282b are disconnected to each other) by the undercut 274 formed under the edge of the emission region, the pixel electrode 282a is automatically patterned. Therefore, no additional masking process is needed. After the pixel electrode 282a is formed, the thin layer 282b for the pixel electrode still remains in a portion other than the emission region.

Referring to FIG. 3, which shows a detailed cross-sectional view of the edge of the emission region of the OLED according to the present invention, a correlation between the thickness t of the pixel electrode 282a and the depth T of the undercut 274 can be observed. As illustrated in FIG. 3, when the depth T of the undercut 274 is at least twice as great as the thickness t of the pixel electrode 282a, the pixel electrode 282a can be reliably patterned. For example, if the thickness t of the pixel electrode 282a is 150 Å, the depth T of the undercut 274 should be 300 Å or more.

Thereafter, a pixel defining layer (not shown) is formed on the entire surface of the resultant structure and patterned by photolithography and etching processes, thereby forming a pixel defining layer pattern 290 to expose the emission region.

Subsequently, an organic layer 284 including at least an emission layer is formed on a portion of the emission region where the pixel defining layer pattern 290 is exposed. The organic layer 284 is formed by a small molecule deposition method, or a laser induced thermal imaging method. Also, the organic layer 284 may be a laminated structure that further includes at least one selected from the group consisting of an electron injection layer (EIL), an electron transport layer (ETL), a hole injection layer (HIL), a hole transport layer (HTL), and a hole blocking layer (HBL).

Finally, an opposite electrode (not shown) is formed, thereby completing the OLED. The opposite electrode is a transparent electrode.

In the exemplary embodiments of the present invention as described above, when a reflective layer is patterned, an undercut is formed under an edge of a reflective layer pattern by performing over-etching. Thereafter, a thin layer for a pixel electrode is deposited thereon so that the thin layer for the pixel electrode can be opened in the edge of an emission region. (That is, the thin layer on the reflective layer pattern and the thin layer on the other portion are disconnected to each other.) As a result, a pixel electrode can be formed without adding photolithography and etching processes, thereby simplifying the process and increasing the yield.

Although the present invention has been described with reference to certain exemplary embodiments thereof, it will be understood by those skilled in the art that a variety of modifications and variations may be made to the present invention without departing from the spirit or scope of the present invention defined in the appended claims, and their equivalents.

What is claimed is:

1. An organic light emitting display, comprising:
   a substrate;
   a thin-film transistor disposed on the substrate, the thin film transistor comprising a gate electrode, a source electrode and a drain electrode;
   an insulating layer disposed on the substrate, the insulating layer having a via-contact hole;
   a reflective layer pattern disposed in an emission region and connected to one of the source electrode and the drain electrode through the via-contact hole, the reflective layer pattern protruding in a horizontal direction by an undercut formed at an edge of the emission region of the insulating layer;
   a first electrode disposed on the reflective layer pattern and the insulating layer, the first electrode disposed on the reflective layer pattern and the first electrode disposed on the insulating layer disconnected to each other at an edge of the reflective layer pattern;
   an organic layer disposed on the first electrode in a portion of the emission region, the organic layer comprising at least an emission layer; and
   a second electrode disposed on the organic layer.

2. The display according to claim 1, wherein the insulating layer is a laminated structure of a passivation layer and a planarization layer.

3. The display according to claim 1, wherein the reflective layer is formed of a metal having a reflectivity of 50% or more.

4. The display according to claim 3, wherein the reflective layer is formed of one selected from a group consisting of Al, Mo, Ti, Au, Ag, Pd, and an alloy thereof.

5. The display according to claim 1, wherein the depth of the undercut is at least twice as great as the thickness of the first electrode.

6. The display according to claim 1, wherein the first electrode is a pixel electrode.

7. The display according to claim 1, wherein the second electrode is a transparent electrode.

8. A method of fabricating an organic light emitting display, comprising:
   preparing a substrate;
   forming a thin-film transistor on the substrate, the thin film transistor comprising a gate electrode, a source electrode and a drain electrode;
   forming an insulating layer on the substrate, the insulating layer having a via-contact hole;
   forming a reflective layer pattern protruding in a horizontal direction in an emission region by an undercut at an edge of the emission region of the insulating layer, the reflective layer pattern connected to one of the source electrode and the drain electrode through the via-contact hole;
   forming a first electrode on the reflective layer pattern and the insulating layer, the first electrode disposed on the reflective layer pattern and the first electrode disposed on the insulating layer disconnected to each other by the undercut;
   forming an organic layer comprising at least an emission layer on the first electrode in a portion of the emission region; and
   forming a second electrode on the organic layer.

9. A display fabricated according to claim 8, wherein:
   the depth of the undercut is at least twice as great as the thickness of the first electrode;
   the first electrode is a pixel electrode; and
   the second electrode is a transparent electrode.

* * * * *